United States Patent
Xie et al.

(10) Patent No.: US 12,057,371 B2
(45) Date of Patent: Aug. 6, 2024

(54) SEMICONDUCTOR DEVICE WITH EARLY BURIED POWER RAIL (BPR) AND BACKSIDE POWER DISTRIBUTION NETWORK (BSPDN)

(71) Applicant: International Business Machines Corporation, Armonk, NY (US)

(72) Inventors: Ruilong Xie, Niskayuna, NY (US); Balasubramanian Pranatharthiharan, Watervliet, NY (US); Mukta Ghate Farooq, Hopewell Jct, NY (US); Brent Anderson, Jericho, VT (US)

(73) Assignee: International Business Machines Corporation, Armonk, NY (US)

( * ) Notice: Subject to any disclaimer, the term of this patent is extended or adjusted under 35 U.S.C. 154(b) by 269 days.

(21) Appl. No.: 17/511,486

(22) Filed: Oct. 26, 2021

(65) Prior Publication Data
US 2023/0132353 A1    Apr. 27, 2023

(51) Int. Cl.
*H01L 23/48*    (2006.01)
*H01L 21/768*   (2006.01)
(Continued)

(52) U.S. Cl.
CPC ...... *H01L 23/481* (2013.01); *H01L 21/76898* (2013.01); *H01L 21/823431* (2013.01);
(Continued)

(58) Field of Classification Search
CPC ....... H01L 23/00; H01L 23/48; H01L 23/485; H01L 23/481; H01L 23/522;
(Continued)

(56) References Cited

U.S. PATENT DOCUMENTS 7,439,151 B2    10/2008 Coolbaugh
8,685,806 B2    4/2014  Dyer
(Continued)

OTHER PUBLICATIONS

Power Electronics World, Imec Demonstrates Excellent Performance of Si FinFET CMOS devices, downloaded Nov. 21, 2023 from https://powerelectronicsworld.net/article/111468/Imec_Demonstrates_Excellent_Performance_Of_Si_FinFET_CMOS_Devices, dated Tuesday Jun. 16, 2020, 16 pages.

(Continued)

*Primary Examiner* — Chuong A Luu
(74) *Attorney, Agent, or Firm* — Daniel Morris; Otterstedt & Kammer PLLC

(57) ABSTRACT

A semiconductor structure includes a power distribution network including a first buried power rail, a power wire, and a first buried via electrically interconnecting the first buried power rail and the power wire. Each of the first buried power rail, the power wire, and the first buried via have a liner on a corresponding bottom surface thereof and sidewalls thereof. The structure also includes a dielectric layer outward of the power distribution network; a first field effect transistor outward of the dielectric layer; a first via trench contact electrically interconnecting a source/drain region of the transistor to the first buried power rail; a first outer wire outward of the first field effect transistor; and an electrical path electrically interconnecting the first outer wire with the power wire.

12 Claims, 14 Drawing Sheets

(51) Int. Cl.
  *H01L 21/8234* (2006.01)
  *H01L 23/00* (2006.01)
  *H01L 23/522* (2006.01)
  *H01L 27/088* (2006.01)

(52) U.S. Cl.
  CPC .. *H01L 21/823475* (2013.01); *H01L 23/5226* (2013.01); *H01L 24/83* (2013.01); *H01L 27/0886* (2013.01)

(58) Field of Classification Search
  CPC . H01L 23/528; H01L 23/535; H01L 23/5226; H01L 23/5286; H01L 24/83; H01L 27/088; H01L 27/0886; H01L 21/74; H01L 21/743; H01L 21/768; H01L 21/76895; H01L 21/76898; H01L 21/8234; H01L 21/8238; H01L 21/823431; H01L 21/823475; H01L 21/823871; H01L 21/823487
  USPC ........................................................ 257/288
  See application file for complete search history.

(56) References Cited

U.S. PATENT DOCUMENTS

| | | |
|---|---|---|
| 9,570,395 B1 | 2/2017 | Sengupta et al. |
| 9,711,501 B1 | 7/2017 | Basker |
| 10,586,765 B2 | 3/2020 | Smith et al. |
| 10,636,739 B2 | 4/2020 | Beyne et al. |
| 10,700,207 B2 | 6/2020 | Chen et al. |
| 10,748,901 B2 | 8/2020 | Rubin |
| 10,872,818 B2 | 12/2020 | Chiang |
| 10,886,224 B2 | 1/2021 | Gerousis |
| 10,892,215 B2 | 1/2021 | Nelson |
| 10,903,165 B2 | 1/2021 | Rubin |
| 10,985,103 B2 | 4/2021 | Hong |
| 2009/0251848 A1 | 10/2009 | Anderson |
| 2012/0292777 A1 | 11/2012 | Lotz |
| 2020/0105671 A1 | 4/2020 | Lai et al. |
| 2020/0135634 A1 | 4/2020 | Chiang |
| 2020/0203276 A1 | 6/2020 | Hiblot |
| 2020/0373241 A1 | 11/2020 | Gerousis |
| 2020/0402909 A1 | 12/2020 | Hong |
| 2021/0028112 A1* | 1/2021 | Kim ................. H01L 29/41791 |
| 2021/0143127 A1 | 5/2021 | Jain |
| 2021/0233834 A1 | 7/2021 | Chen |

OTHER PUBLICATIONS

Prasad D, Nibhanupudi ST, Das S, Zografos O, Chehab B, Sarkar S, Baert R, Robinson A, Gupta A, Spessot A, Debacker P. Buried power rails and back-side power grids: Arm® cpu power delivery network design beyond 5nm. In2019 IEEE International Electron Devices Meeting (IEDM) Dec. 7, 2019 (pp. 19-1). IEEE. (Abstract only 3 pages).

Jake Hertz, Scaling Down: Intel Boasts RibbonFET and PowerVia as Next IC Design Solution, Article dates Jul. 30, 2021, All About Circuits, downloaded Nov. 21, 2023 from https://www.allaboutcircuits.com/news/scaling-down-intel-boasts-ribbonfet-and-powervia-as-next-ic-design-solution/#:~:text=Amongst%20the%20announcements%2C%20Intel%20also,architecture%20since%20FinFET%20in%202011. 5 pages.

Filip, Hannelore, European Patent Office, The International Search Report and the Written Opinion, Feb. 22, 2023, 13 pages, from counterpart PCT Application EP2022/077464.

* cited by examiner

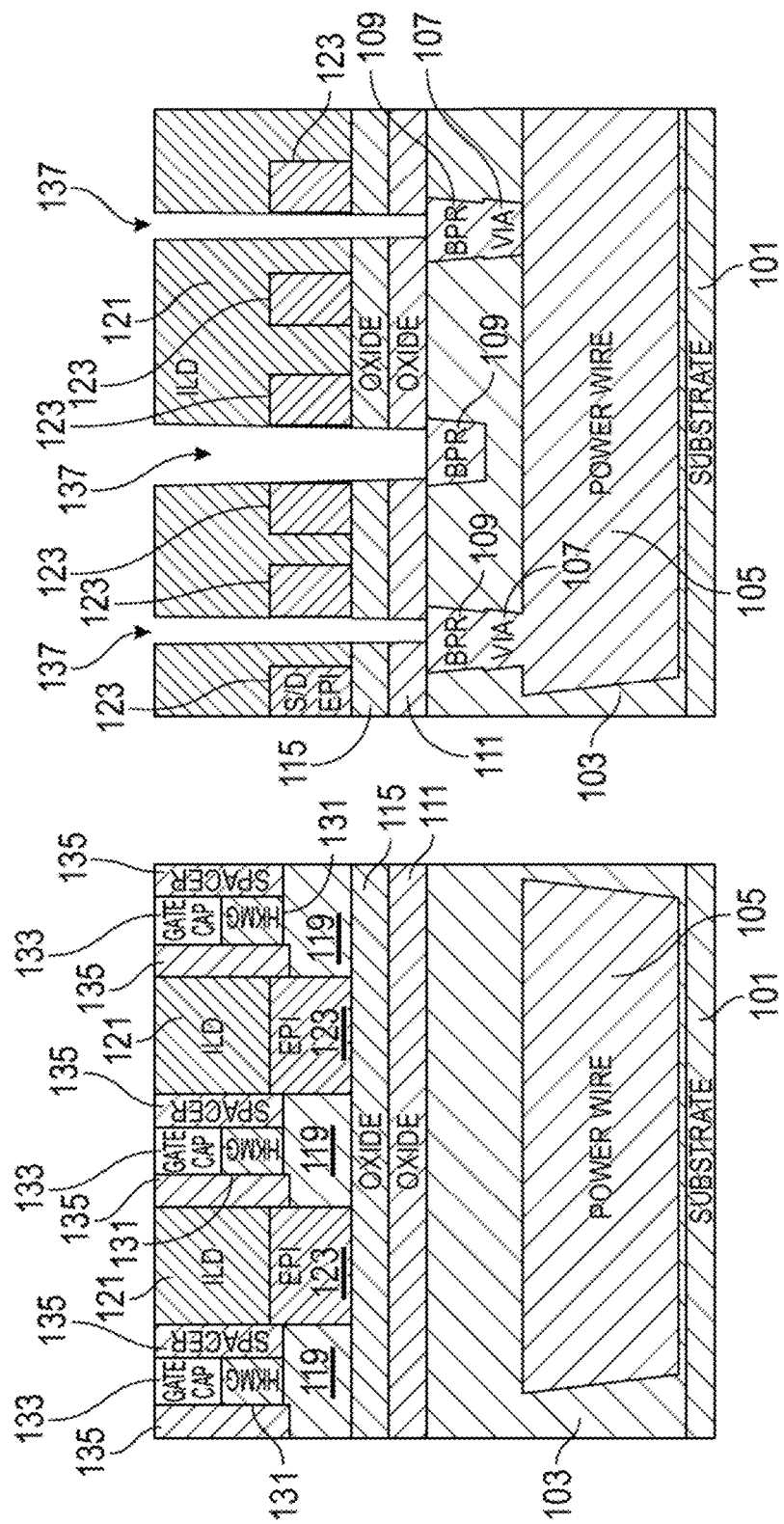

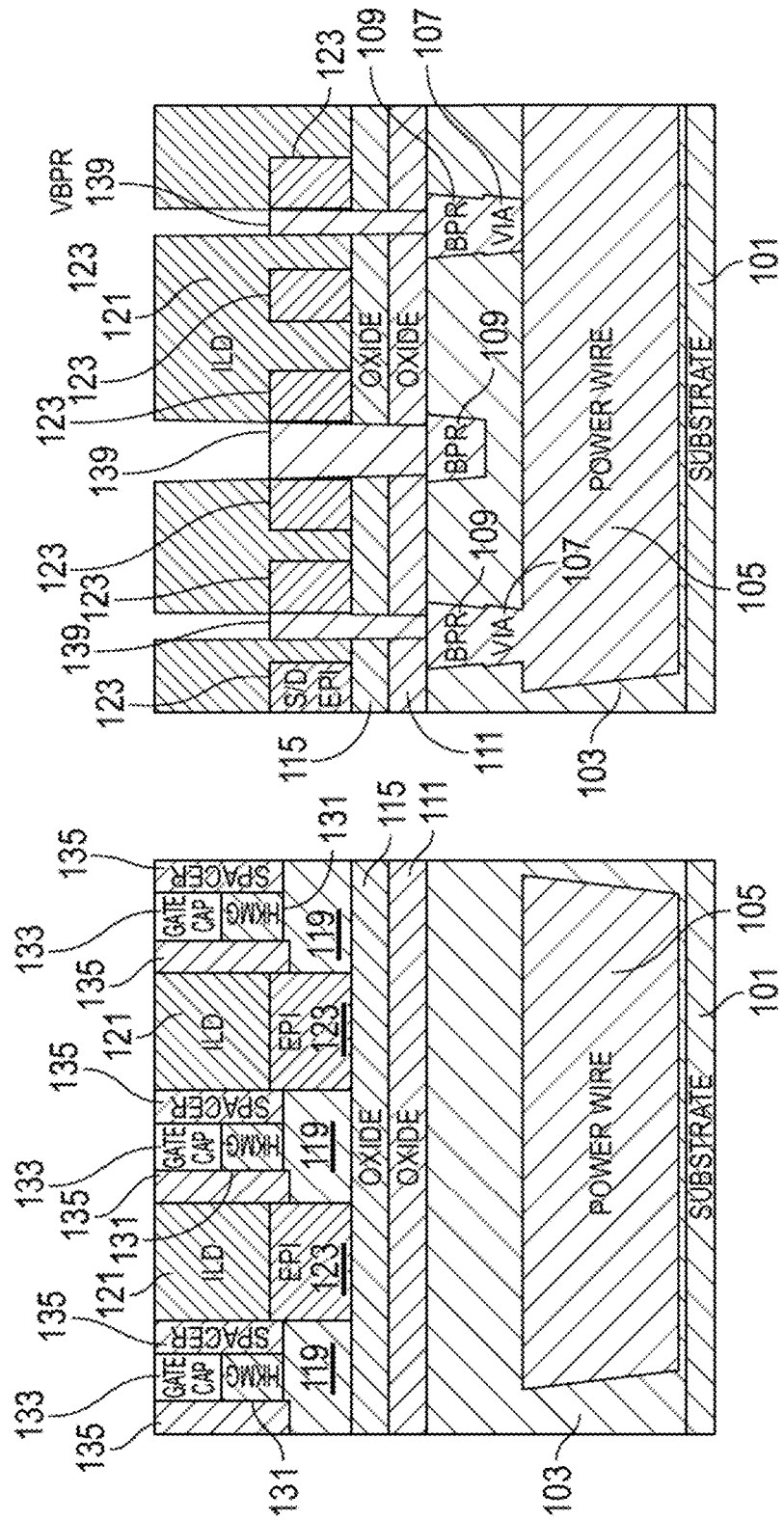

SEMICONDUCTOR DEVICE WITH EARLY BURIED POWER RAIL (BPR) AND BACKSIDE POWER DISTRIBUTION NETWORK (BSPDN)

BACKGROUND

The present invention relates generally to the electrical, electronic and computer arts and, more particularly, to integrated circuits such as complementary metal oxide semiconductor (CMOS) integrated circuits.

Buried power rails and backside power distribution networks are very attractive schemes for future CMOS scaling. Most prior art techniques focus on backside wafer processing.

Prior art techniques directly form power rails and backside power distribution from the backside of the wafer, which may require challenging processes such as substrate thinning and backside lithographic alignment for fine features.

BRIEF SUMMARY

Principles of the invention provide techniques for an early buried power rail (BPR) and backside power distribution network (BSPDN) scheme. In one aspect, an exemplary semiconductor structure includes a power distribution network including a first buried power rail, a power wire, and a first buried via electrically interconnecting the first buried power rail and the power wire; a dielectric layer outward of the power distribution network; a first field effect transistor outward of the dielectric layer, the first field effect transistor having a source/drain region and a gate; a first via trench contact electrically interconnecting the source/drain region to the first buried power rail; a first outer wire outward of the first field effect transistor; and an electrical path electrically interconnecting the first outer wire with the power wire. Each of the first buried power rail, the power wire, and the first buried via have a liner on a corresponding bottom surface thereof and sidewalls thereof.

In another aspect, an exemplary method of forming a semiconductor structure includes forming, on a first wafer, a power distribution network including a first buried power rail, a power wire, and a first buried via electrically interconnecting the first buried power rail and the power wire; forming a lower oxide layer outward of the buried power rail; bonding a second wafer oxide layer of a second wafer to the lower oxide layer; forming a first field effect transistor in the second wafer, the at least one field effect transistor having a source/drain region and a gate; forming a first via trench contact electrically interconnecting the source/drain region to the first buried power rail; forming an electrical path outward from the power wire; and forming a first outer wire during back-end-of-line processing, the first outer wire being in electrical contact with the electrical path.

As used herein, "facilitating" an action includes performing the action, making the action easier, helping to carry the action out, or causing the action to be performed. Thus, by way of example and not limitation, instructions executing on one processor might facilitate an action carried out by semiconductor fabrication equipment, by sending appropriate data or commands to cause or aid the action to be performed.

Techniques as disclosed herein can provide substantial beneficial technical effects. Some embodiments may not have these potential advantages and these potential advantages are not necessarily required of all embodiments. By way of example only and without limitation, one or more embodiments may provide one or more of:

Easy scheme for future CMOS scaling and three-dimensional (3D) integration;
Allows use of relatively thick wires, even with materials with lower conductivity, such as W, or Ru, and it is thus possible to achieve lower resistance compared to Cu wires by increasing the wire size;
reduces the routing complexity and increases the routing flexibility for back-end-of-line wring.

These and other features and advantages will become apparent from the following detailed description of illustrative embodiments thereof, which is to be read in connection with the accompanying drawings.

BRIEF DESCRIPTION OF THE DRAWINGS

The following drawings are presented by way of example only and without limitation, wherein like reference numerals (when used) indicate corresponding elements throughout the several views, and wherein:

FIGS. 6B-15 show additional exemplary steps in the fabrication of an exemplary semiconductor structure, according to aspects of the invention;

It is to be appreciated that elements in the figures are illustrated for simplicity and clarity. Common but well-understood elements that may be useful or necessary in a commercially feasible embodiment may not be shown in order to facilitate a less hindered view of the illustrated embodiments.

DETAILED DESCRIPTION

Principles of inventions described herein will be in the context of illustrative embodiments. Moreover, it will become apparent to those skilled in the art given the teachings herein that numerous modifications can be made to the embodiments shown that are within the scope of the claims. That is, no limitations with respect to the embodiments shown and described herein are intended or should be inferred.

One or more embodiments provide an early (i.e., formed early in the fabrication process) buried power rail (BPR) and backside power distribution network (BSPDN) scheme, which also enables buried local interconnects. One or more embodiments supply power to a backside power distribution network which includes one or more levels of power wires underneath the buried power rails, and then deliver the power to buried power rails through buried vias. In one or more embodiments, the power wires also connect to a back-end-of-line (BEOL) interconnect. Thus, in one or more embodiments, power wires connect to buried power rails. Advantageously, one or more embodiments are not limited to FinFET embodiments.

Figure 1:
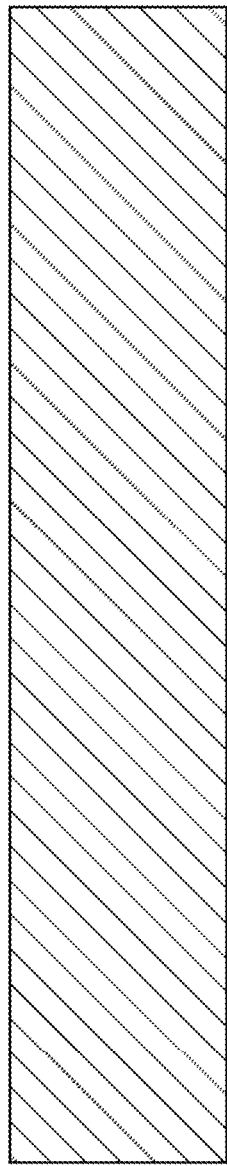
FIGS. 1-5 show exemplary steps in the fabrication of an exemplary semiconductor structure, according to aspects of the invention.
Figure 2:
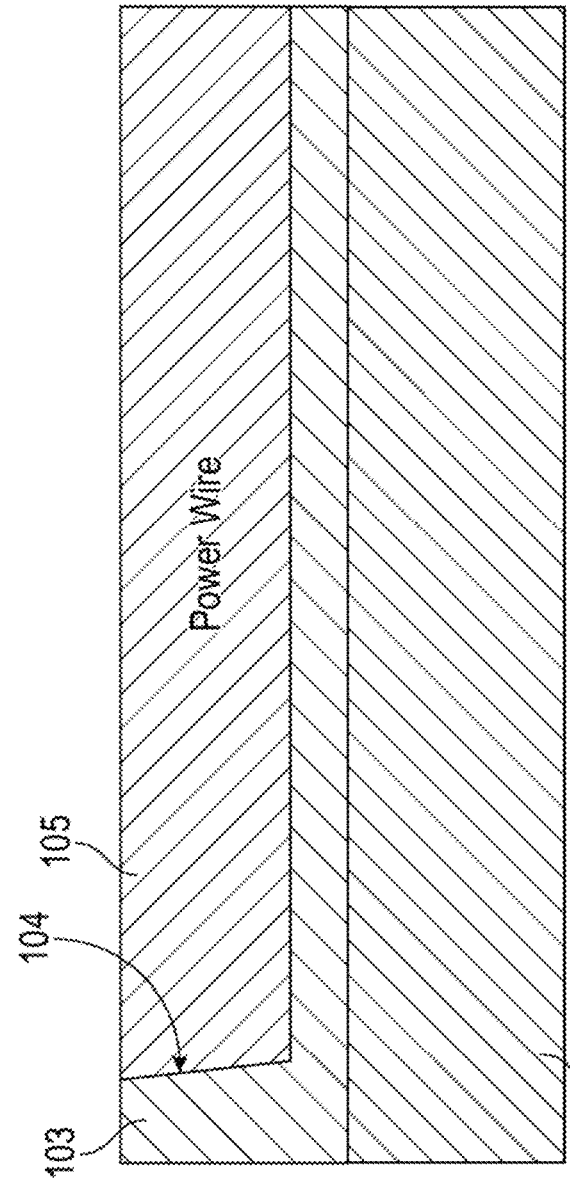

Consider now an exemplary technique for fabricating an exemplary semiconductor structure, according to an aspect of the invention. Referring to FIG. 1, note starting wafer 101 (e.g., an Si wafer). In FIG. 2, deposit inter-layer dielectric (ILD) 103 and form at least one layer of power wires (e.g., power wire 105). Note that in FIG. 2, only one layer of power wires is depicted for illustrative convenience; however, there can be more than one layer of power wires, interconnected with vias in between different levels. It will be appreciated that power wire 105 exhibits a tapered sidewall angle as seen at 104, indicative of the power wires being formed prior to the device (e.g., transistors, discussed below) formation. The same is true of buried power rails and vias, as will be further discussed below. Indeed, in one or more embodiments, power wires, buried power rails, and vias are formed early (i.e., prior to the device formation) as opposed to late (i.e., backside power rail and power wires formation after: frontside device and BEOL interconnect, wafer flip, substrate removal, and backside ILD deposition). Stated in another way, the angle of the edges indicates that metal wires are pre-formed in the ILD, and are not being formed from the back side of the wafer after front side processing.

Thus, as discussed herein, one or more embodiments exhibit a tapered profile wherein the buried power rails, power wires, vias between the buried power rail and power wires, and (where present) vias between different levels of power wires (omitted from drawings to avoid clutter), have tapered/angled sidewalls, such that the critical dimension (CD) towards the frontside device (i.e., "up" in the figures) is larger than the CD towards the substrate 101 (i.e., "down" in the figures).

Advantageously, in one or more embodiments, there are no other wires located in the back side of the wafer, and thus power wire 105 can be very "fat" and thick (in a non-limiting example, the buried power rail and backside wires can have a thickness of 200 nm or greater), even with materials with lower conductivity, such as W, or Ru, and it is thus possible to achieve lower resistance compared to Cu wires by increasing the wire size.

Figure 3:
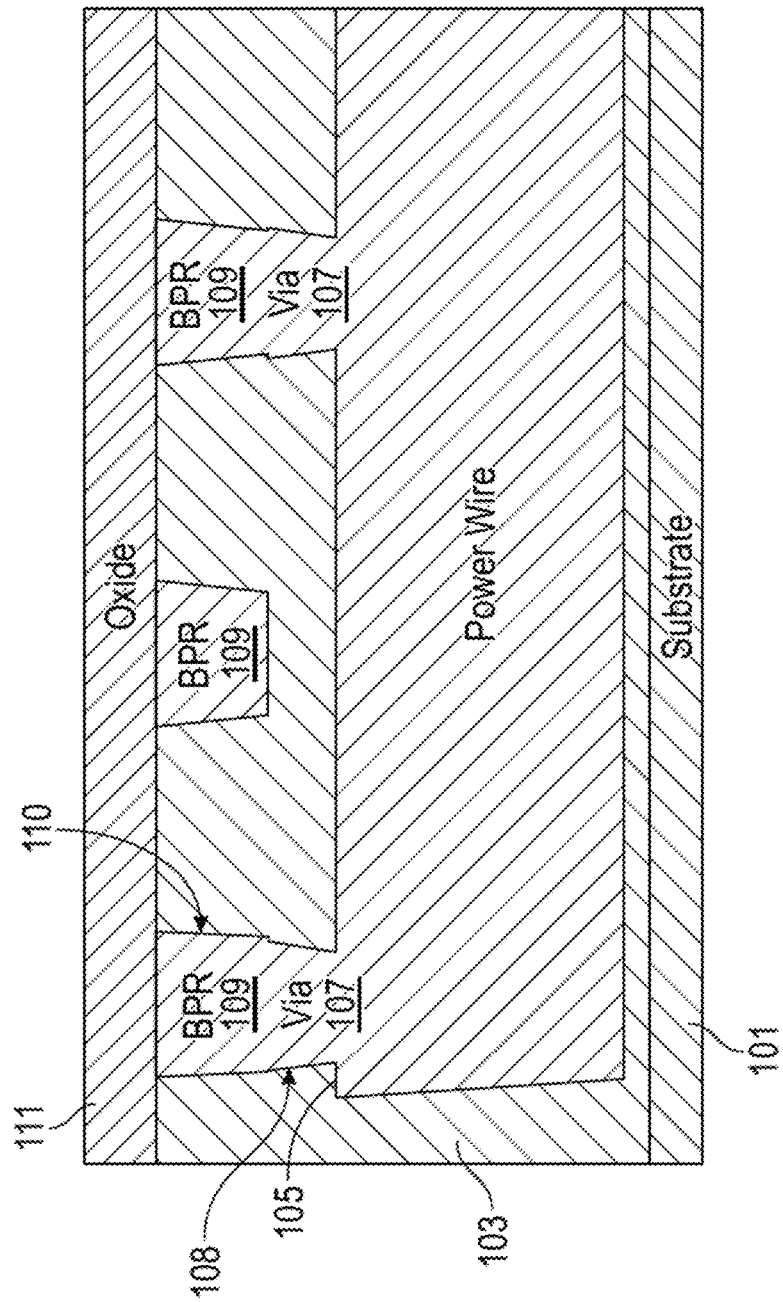

In FIG. 3, deposit additional ILD. Pattern the additional ILD for vias 107 and BPRs 109. Then deposit metal to form the vias 107 and BPRs 109, and cap with oxide 111 (e.g., $SiO_2$, or any suitable dielectric for bonding purposes, such as SiN). Exemplary metallization materials for the power wire 105, vias 107, and BPR 109 include a thin (in a non-limiting example, from about 1 to about 5 nm) metal adhesion layer, such as a TiN liner, followed by bulk metal fill, such as W, Ruthenium, or the like, which have good thermal stability at temperatures greater than 900° C. The liners are omitted from the figures, except FIG. 20, to avoid clutter. After metal fills, the chemical-mechanical polishing (CMP) process can be used to planarize the structure. Exemplary materials for the ILD layer(s) include $SiO_x$, low-k oxide (with dielectric constant <3.9), SiN, or combinations of those materials (e.g., SiN and $SiO_2$). It will be appreciated that via 107 exhibits a tapered sidewall angle as seen at 108, and BPR 109 exhibits a tapered sidewall angle as seen at 110, indicative of the buried power rails and vias being formed prior to the device formation, as alluded to above.

Figures 4, 5:
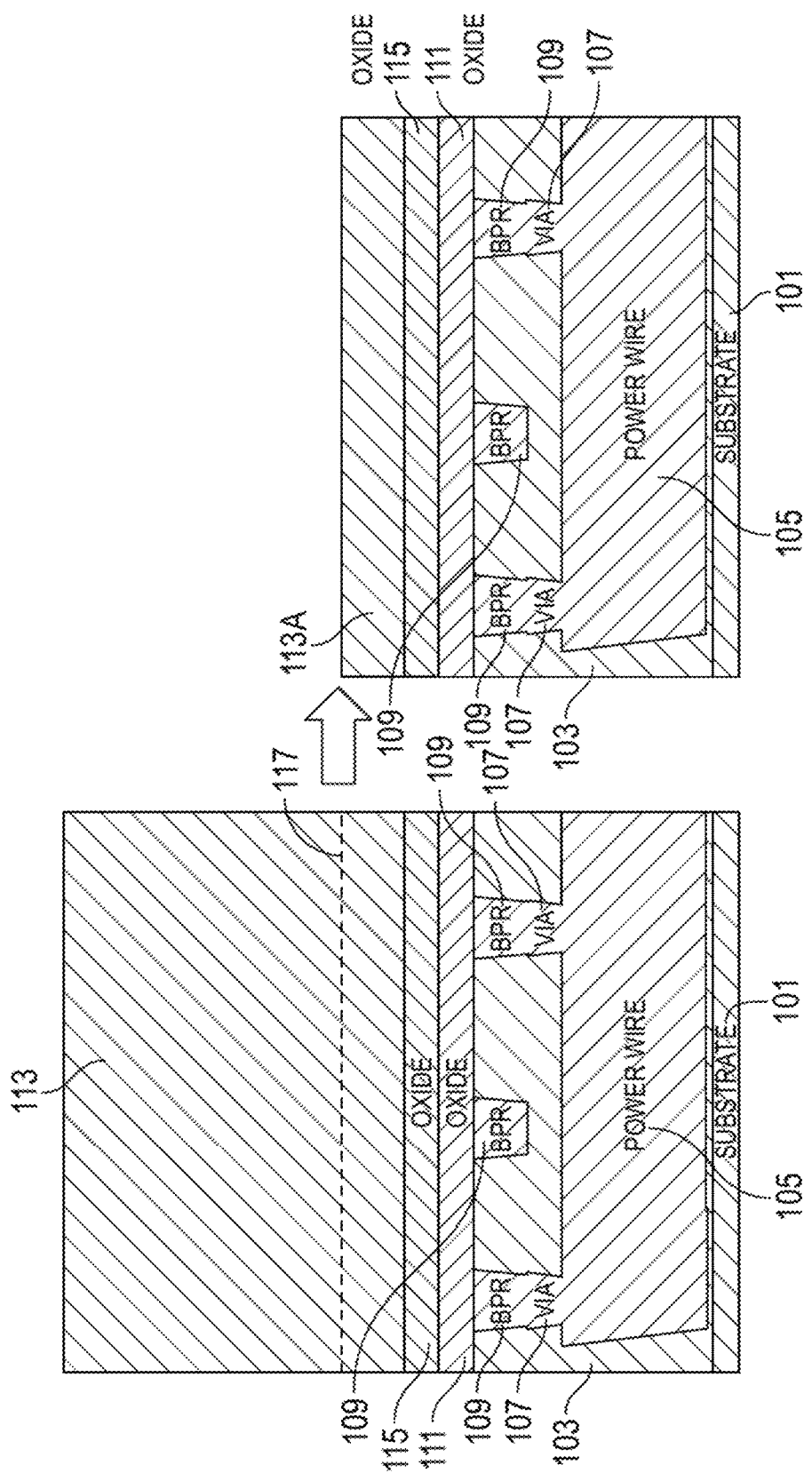

In FIG. 4, bond another wafer 113 using a conventional dielectric-dielectric bonding process, such as oxide-to-oxide bonding, with oxide 115 on substrate 113 to oxide 111 over wafer 101. In FIG. 5, carry out a substrate thinning process to reduce the thickness of the wafer 113 as seen at 113A. One non-limiting example of suitable process is the SmartCut process. The cut wafer is designated as 113A. The SmartCut process involves the implantation of ions (e.g., along line 117) within a monocrystalline silicon wafer 113. The ions, typically hydrogen ions (H+), form a layer of microbubbles parallel to the wafer surface that later functions as a cleavage plane. The implanted wafer is fractured along the hydride-rich plane. In an exemplary embodiment, a microbubble layer is formed within the substrate 113 along line 117 at a depth corresponding to the desired thickness of the layer 113A. The layer to be cleaved using the SmartCut process or other suitable process can have, for example, a uniform thickness. Another example of a suitable process is Si thinning, stopping over a certain etch stop layer, such as a thin SiGe epitaxial layer or buried oxide (BOX) layer if wafer 113 is a silicon-on-insulator (SOI) wafer. In one or more embodiments, the remaining Si 113A is used to form active devices.

Figure 6A:
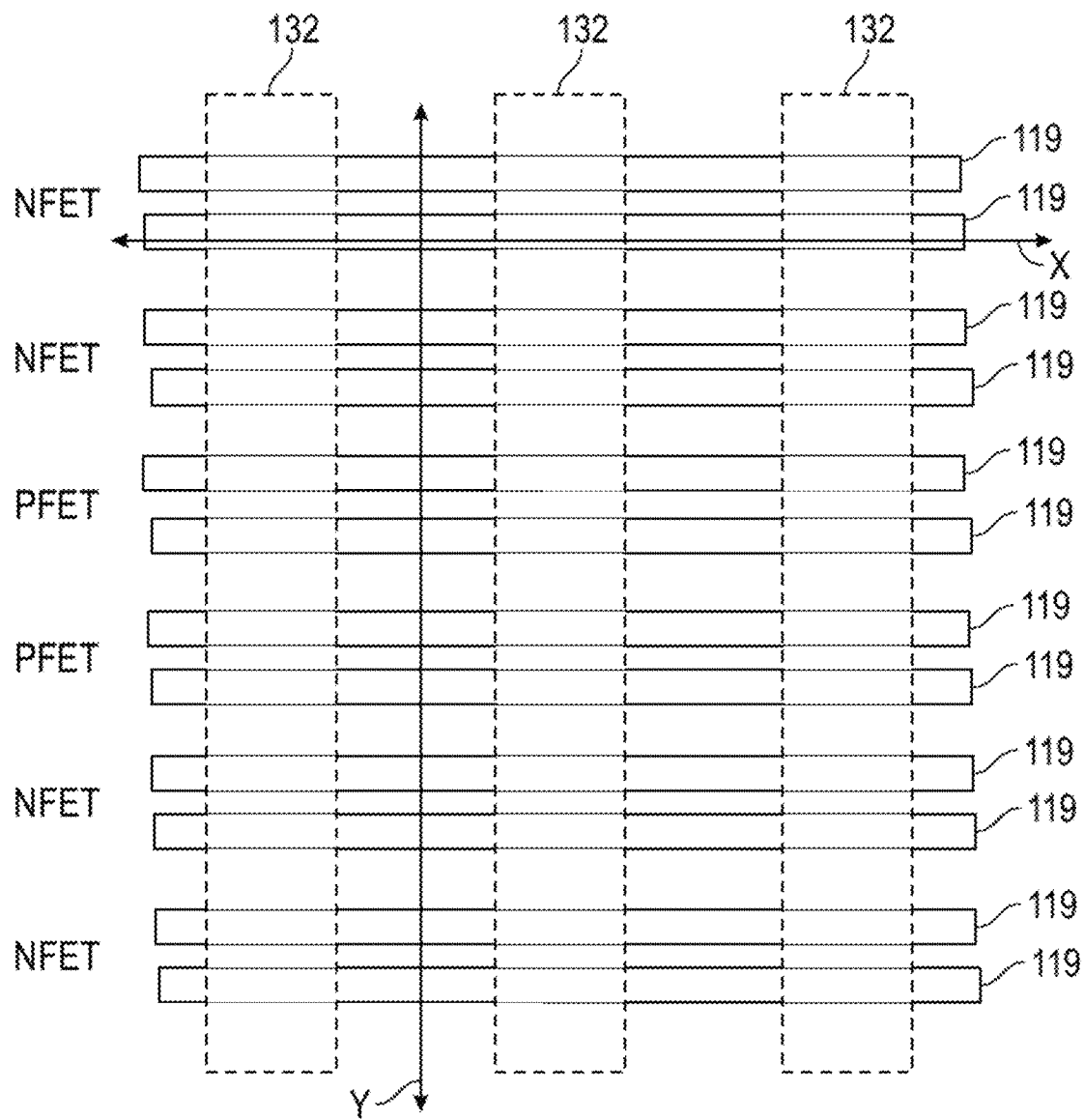
FIG. 6A shows a top view representative of one or more exemplary embodiments.
Figure 18:
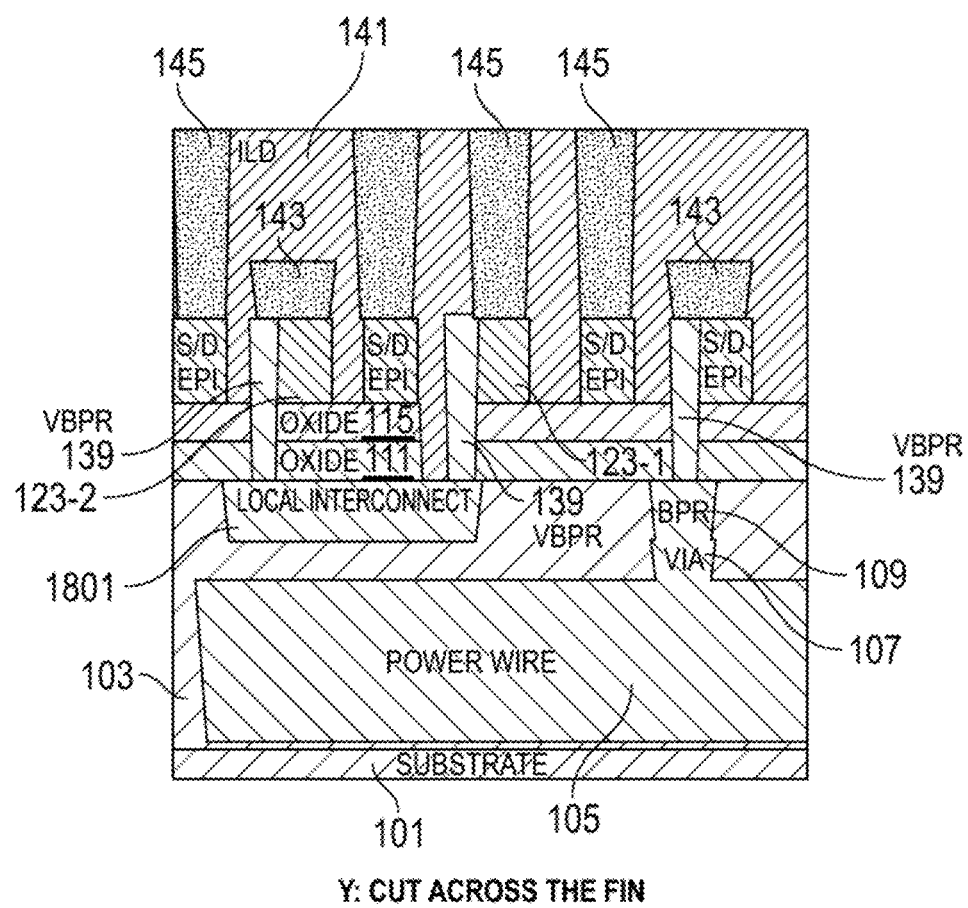
FIG. 18 shows exemplary details of a local interconnect, according to aspects of the invention.
Figure 20:
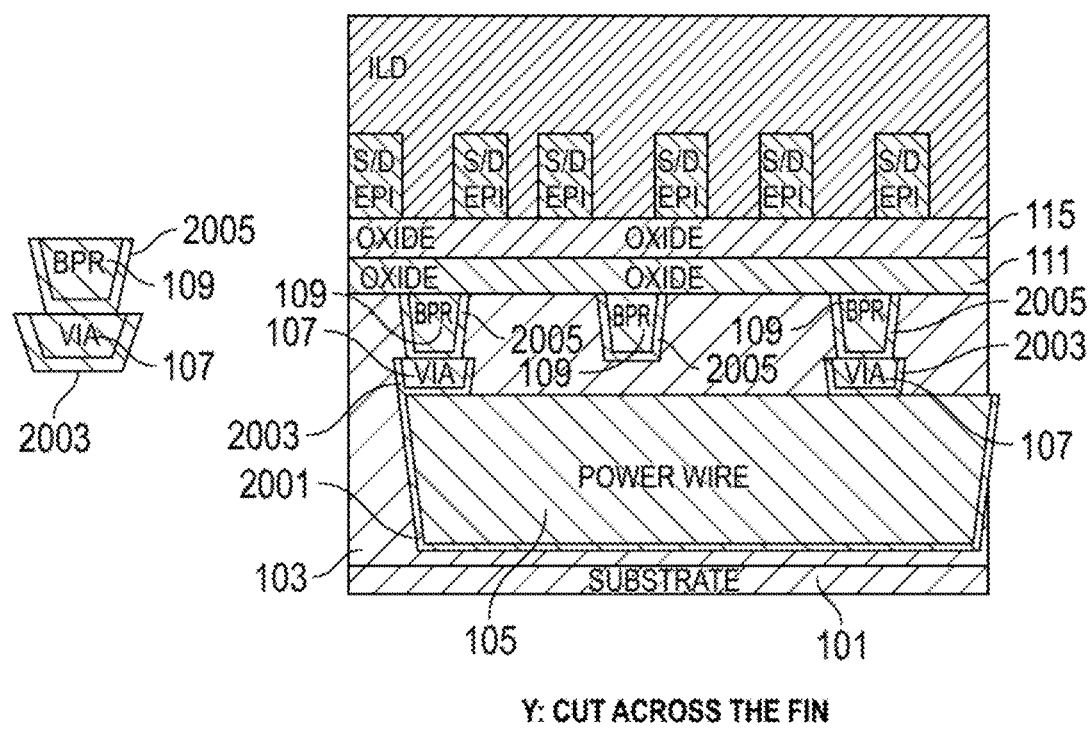
FIG. 20 shows exemplary details of metal adhesion liners for a power wire, vias, and buried power rails, in accordance with aspects of the invention.

FIG. 6A is a top plan view representative of one or more exemplary embodiments. Note the gates 132 (e.g., formed by gate stacks 131 and gate caps 133 discussed below), fins 119, and lines X and Y. In each of FIGS. 6B-15, the left-hand view is a view cut along the fin (line X in FIG. 6A), while the right-hand view is a view cut across the fin (line Y in FIG. 6A). FIGS. 18 and 20 are views cut across the fin (line Y in FIG. 6A). Note that as indicated by the labels NFET and PFET, there will be two adjacent NFET devices, two adjacent PFET devices, two adjacent NFET devices, and so on.

Figures 6B, 7:
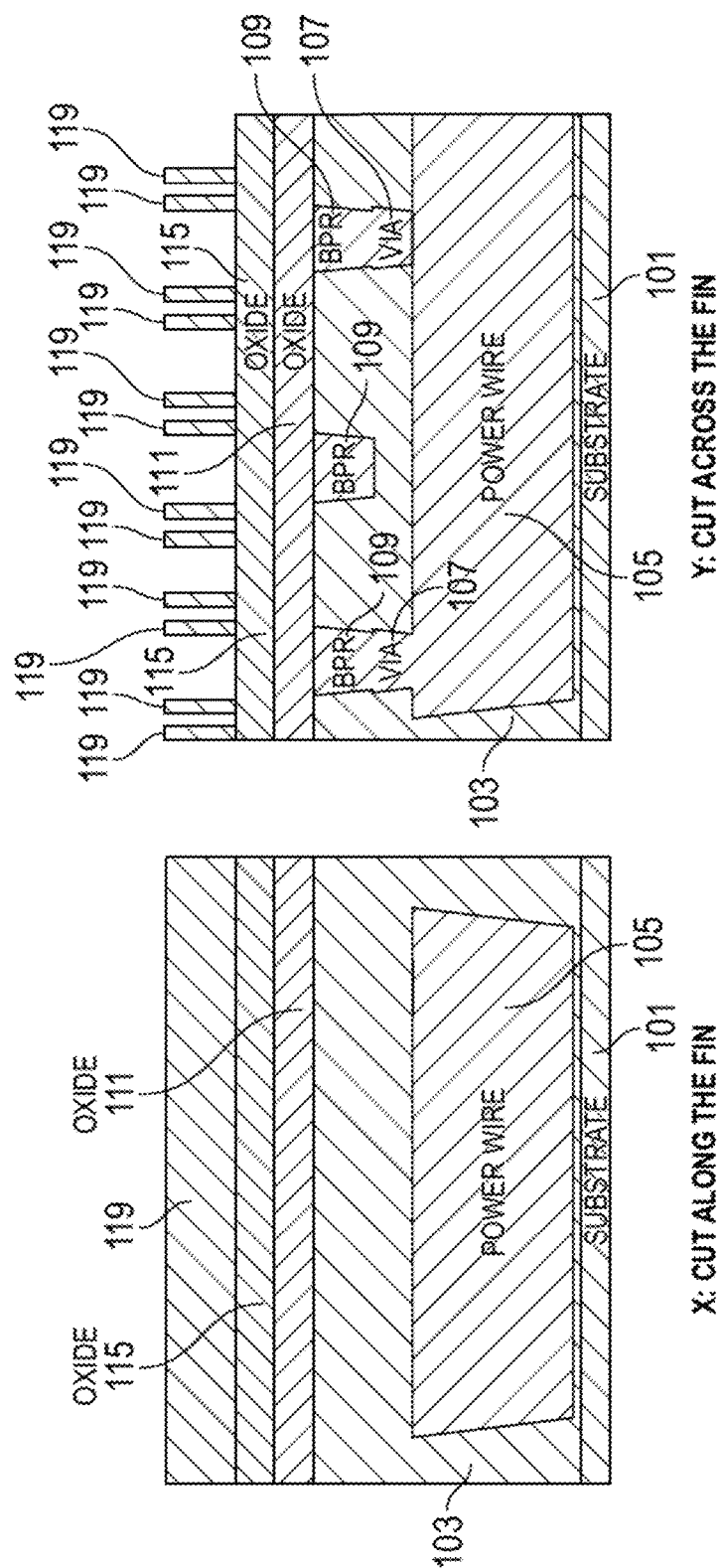

In FIGS. 6B and 7, carry out fin patterning in layer 113A. Conventional lithography and etching processes can be employed, such as self-aligned dual patterning (SADP), self-aligned quadruple patterning (SAQP), and the like. A suitable fin cut process can be done as well, to remove any unwanted fins after a "sea of fins" formation.

Figures 8, 9:
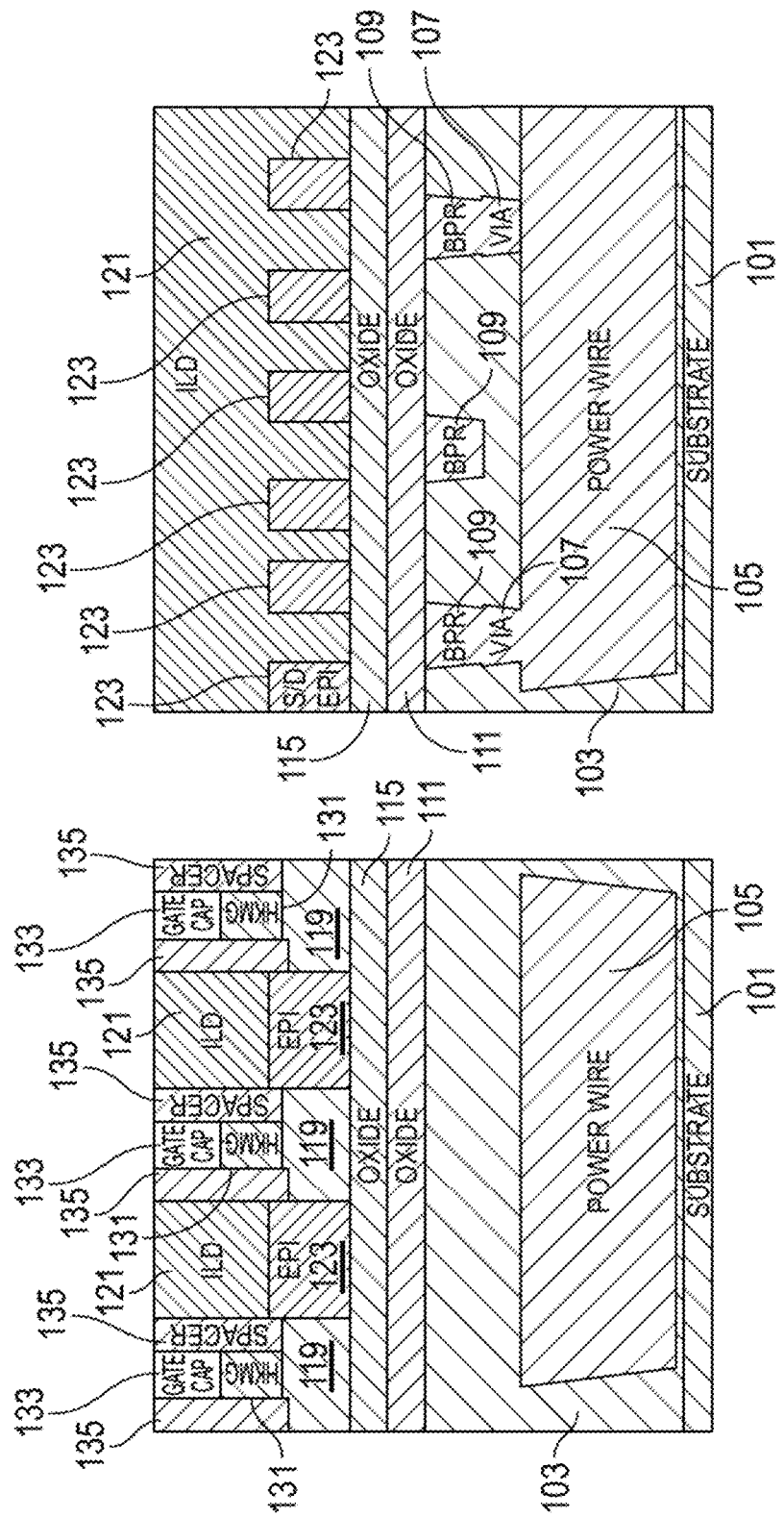

FIGS. 8 and 9 show the structure of FIGS. 6 and 7 after FEOL processing. FIG. 8 is a view in the X direction, cut along the fins, while FIG. 9 is a view in the Y direction, cut across the fins 119 between the gates (S/D region). Note the ILD 121, source/drain epitaxy 123, high-k metal gate stacks 131, gate caps 133, and spacers 135; the same can be implemented using conventional features and techniques commonly used to form transistors, and can be fabricated using a conventional FinFET process flow, for example.

FIGS. 10 and 11 show the structure of FIGS. 8 and 9 after forming contact via regions 137 down to the BPR 109. FIG. 10 is a view in the X direction, cut along the fins, while FIG. 11 is a view in the Y direction, cut across the fins. This can be done using conventional lithography and etching processes. Note that the sidewalls of the contact via 137 can touch the S/D epitaxial regions.

FIGS. 12 and 13 show the structure of FIGS. 10 and 11 after metallization in via regions 137 and metal recess, resulting in vias 139 (VBPR). The metallization process includes a first silicide liner, such as Ni, Ti, or NiPt, followed by a metal adhesion liner, such as TiN, followed by a conductive metal fill, such as W, Co, or Ru. After the metal fills, a MP and metal recess process is done, resulting in recessed VBPR vias 139; in one or more embodiments, the top surface of the via 139 is substantially co-planar with the S/D epi 123.

Figures 14, 15:
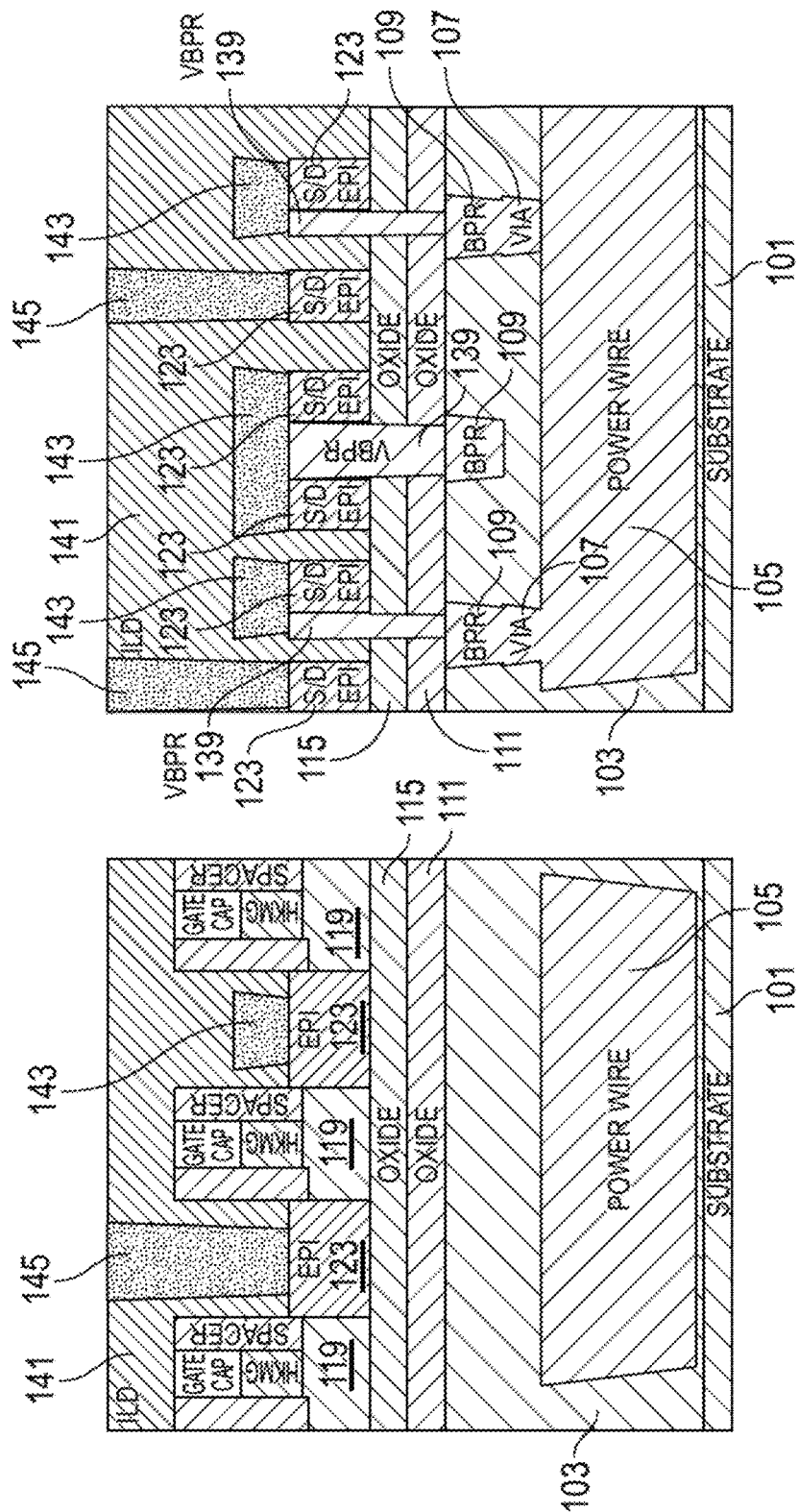

FIGS. 14 and 15 show the structure of FIGS. 12 and 13 after deposition of additional ILD 141 and S/D contact formation. Note that recessed S/D contact(s) 143 are formed to connect the S/D epitaxy to the BPR through the VBPR, and the tall S/D contact(s) 145 are formed to connect the S/D epitaxy to the upper BEOL interconnect levels. The formation of the contacts 143 and 145 can be done by conventional lithography, etching, and metallization processes. The metallization process includes, for example, a first silicide liner, such as Ni, Ti, or NiPt, followed by a metal adhesion liner, such as TiN, followed by conductive metal fill, such as W, Co, or Ru. After the metal fills, a CMP process is applied after the metal fills are done. Additional masking and metal recess processes are carried out to recess the contacts which connect to the buried power rail(s), forming recessed S/D contact(s) 143. This reduces the parasitic capacitance between the contact and gate. Note also that reference characters for certain elements that are fully described with respect to the other figures have been omitted in FIGS. 14 and 15 to avoid clutter.

Figure 16:
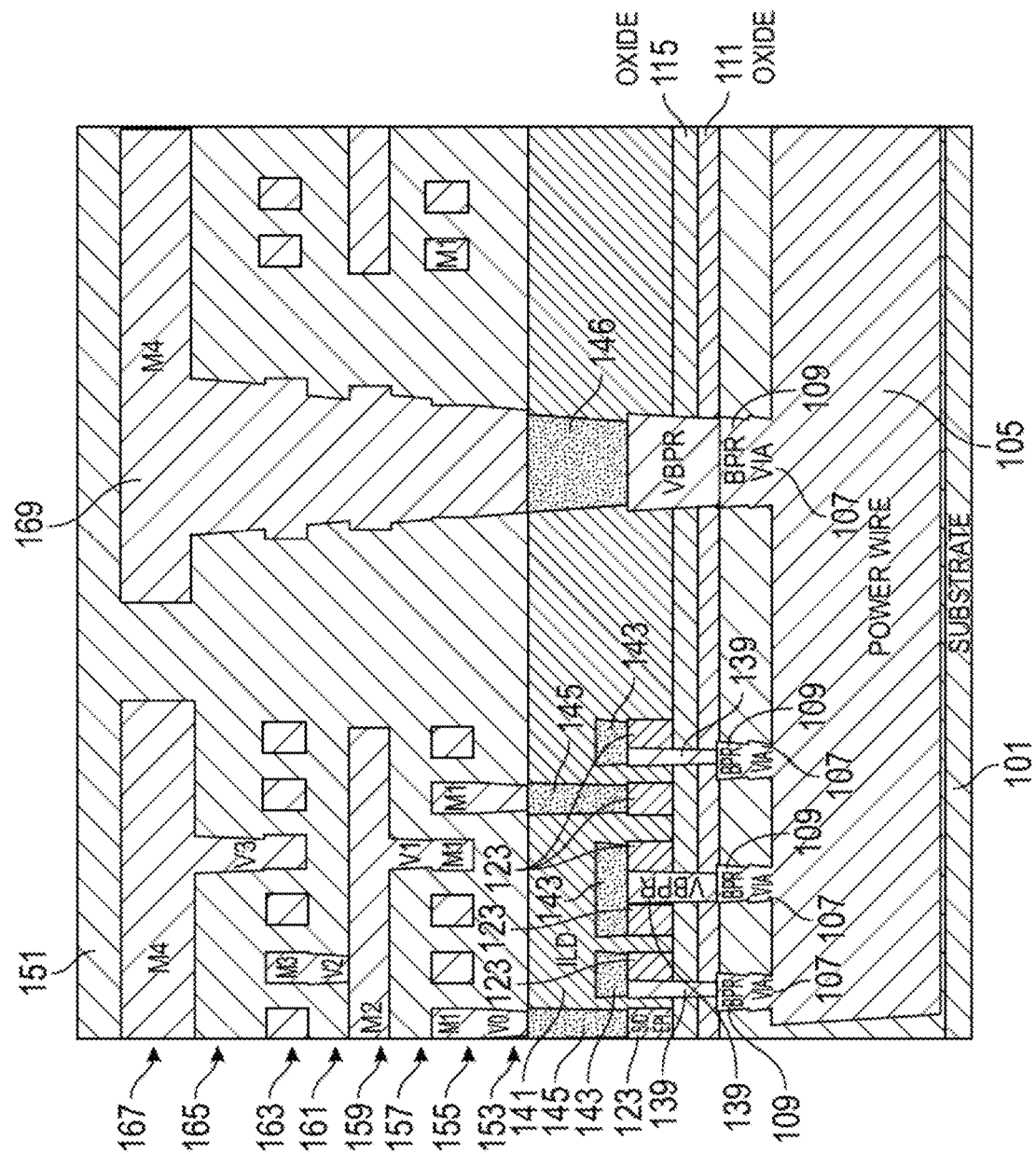
FIG. 16 shows an exemplary semiconductor structure, according to aspects of the invention.

FIG. 16 shows a first option for forming BEOL wiring and connection to BSPDN, employing a sequential connection to BSPDN. Note via layer 0 (V0) numbered 153, metal layer 1 (M1) numbered 155, via layer 1 (V1) numbered 157, metal layer 2 (M2) numbered 159, via layer 2 (V2) numbered 161, metal layer 3 (M3) numbered 163, via layer 3 (V3) numbered 165, and metal layer 4 (M4) numbered 167. The BEOL interconnect(s) can be formed in the BEOL ILD 151 which includes, e.g., low-k dielectric (with a k value<3.9) and other layers such as Cu capping nitride. The metallization process for various metal lines and vias can be done using conventional single damascene or dual damascene processes. The sequential connection is shown at 169, from M4 to electrical path contact 146, and through VBPR 139, BPR 109, and via 107, to wire 105. Contact 146 can be formed, for example, at the same time and in the same manner as tall S/D contacts 145. Note that in this non-limiting exemplary configuration, the metal levels M1, M2, M3 can be used only for signal routing, and only starting from M4, metal lines will be used for both power delivery and signal(s). This greatly reduces the routing complexity and increases the routing flexibility for lower metal lines M1, M2, and M3. Note also that though this schematic shows that M4 is connected to the backside power wires, aspects of the invention also apply to any metal levels lower or higher than M4, or even more than one metal layer (e.g., both M4 and M6 can be connected to backside power wires).

Figure 17:
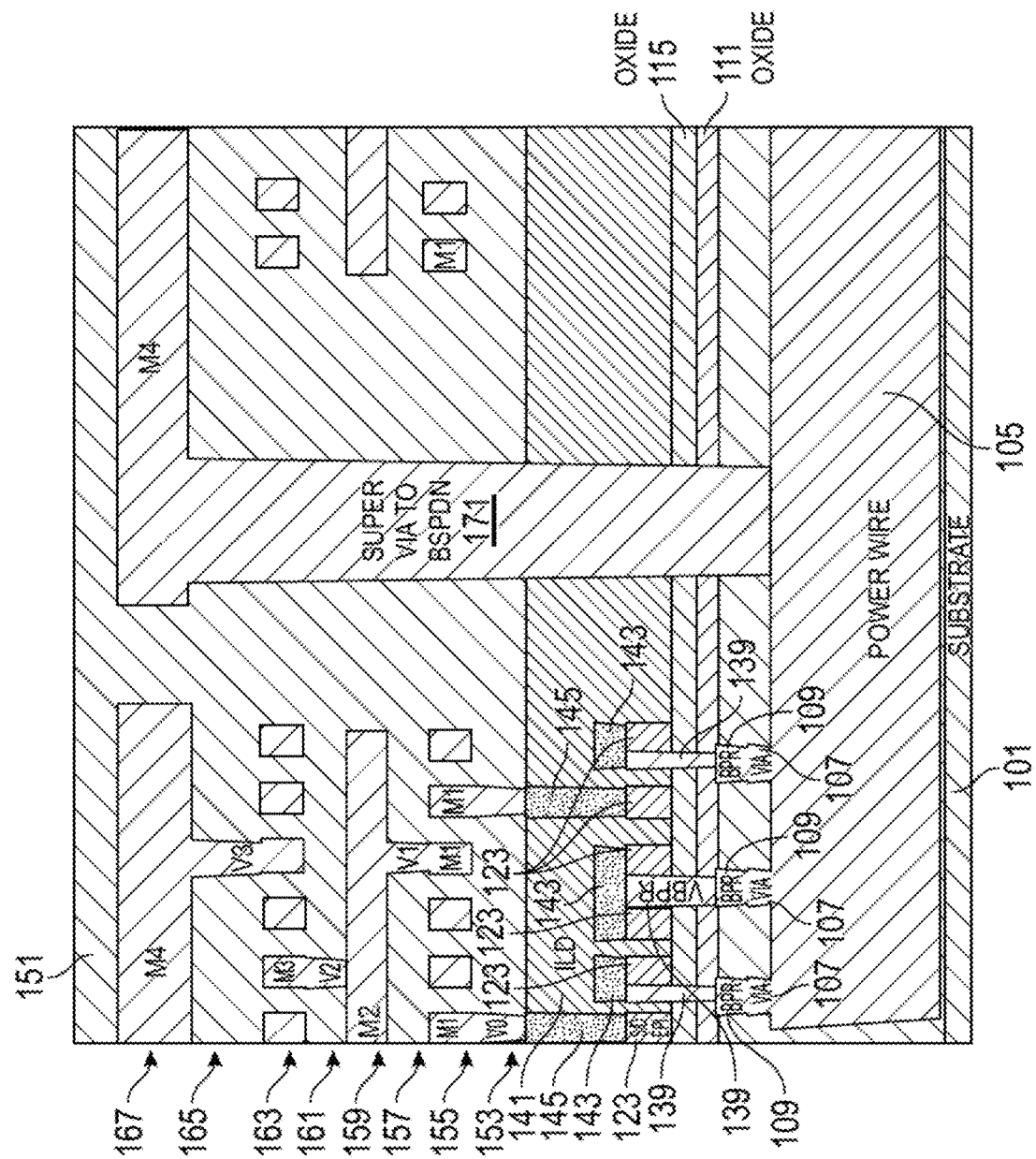
FIG. 17 shows another exemplary semiconductor structure, according to aspects of the invention.

FIG. 17 shows a second option for forming BEOL wiring and connection to BSPDN, employing a skip level connection to BSPDN. Note via layer 0 (V0) numbered 153, metal layer 1 (M1) numbered 155, via layer 1 (V1) numbered 157, metal layer 2 (M2) numbered 159, via layer 2 (V2) numbered 161, metal layer 3 (M3) numbered 163, via layer 3 (V3) numbered 165, and metal layer 4 (M4) numbered 167, which can be fabricated in a similar manner as shown and discussed with regard to FIG. 16. The skip level connection is shown at 171, from M4 to wire 105 using super via 171; for example, using a separate lithographic and etching process. Super via 171 can be metallized separately from M4 using a single damascene process or together with M4 using a dual damascene process, for example.

One or more embodiments thus provide a process flow and structure, including techniques to connect S/D epitaxy 123 to the buried power rail 109, and further provide techniques for different contact structures including tall S/D contacts 145, recessed S/D contacts 143, VBPR 139 which forms silicide at the sidewall of the epitaxy 123, and the like.

One or more embodiments further provide a semiconductor structure including a transistor device with S/D epitaxy 123 and gate 131; and a power distribution network under the transistor device, separated with a dielectric layer (e.g., oxide 111, oxide 115, and ILD 103). The power distribution network (PDN) includes a BPR 109 and a power wire 105, where a via trench contact 139 connects the S/D 123 of the transistor to the BPR 109, the BPR 109 is connected to power wires 105 through buried vias 107, and power wires 105 are connected to the BEOL wires (e.g., M4 167); as shown in FIG. 16 or 17, for example. The FEOL, BEOL, and power distribution network (PDN) contacts/wires all have the same "tapered polarity" suggesting no wafer flip being done. Stated in an alternative manner, the metal features taper from wider at the top to narrower at the bottom as seen in FIGS. 16 and 17, which indicates that, advantageously, it is not necessary to carry out a wafer flip in the exemplary process. Indeed, an advantage in one or more embodiments is that it is not necessary to flip the wafer and remove the substrate, stopping on active device(s), which could be very risky. Furthermore, advantageously, it is not necessary to be concerned about forming fine lithographic patterning from the backside of the wafer, which can also be very challenging.

Still further, one or more embodiments include a method of forming a semiconductor structure including forming a PDN with a buried power rail 109 and buried power wires 105 (see, e.g., FIG. 3); forming an oxide-oxide bonding wafer over the PDN (see, e.g., FIG. 4 with wafer 113 having oxide 115 bonded to oxide 111); forming devices on the bonded wafer (see, e.g., FIGS. 5-9); forming vias 139 to connect the BPR 109 with the devices (see, e.g., FIGS. 11 and 13); forming BEOL wires (see FIGS. 14-17); and connecting BEOL wires (e.g., M4 167) to the buried power wires (e.g., using super via 171 or sequential connection shown at 169, from M4 to electrical path contact 146, and through VBPR 139, BPR 109, and via 107, to wire 105).

One or more embodiments even further provide a BPR and BSPDN early formation scheme (i.e. techniques to form the BPR and BSPDN early in the fabrication process), which also enables buried local interconnects 1801, as seen in FIG. 18. Indeed, one or more embodiments provide a method and structure of forming BSPDN early-on in the fabrication process, followed by fabricating transistors on top of the BSPDN with vias 139 connecting sidewalls of the S/D epitaxy 123 to the buried power rail 109. By forming buried local interconnects such as 1801, it is possible to connect S/D epi 123-1 from one device to S/D epi 123-2 of another device. Local interconnects such as local interconnect 1801 can be formed, for example, at the same time as, and in a similar manner to, BPRs 109. In one or more embodiments, the only difference of interconnect 1801 as compared to the BPRs 109 is that the local interconnect 1801 does not connect to underneath power wires through buried vias.

Semiconductor device manufacturing includes various steps of device patterning processes. For example, the manufacturing of a semiconductor chip may start with, for example, a plurality of CAD (computer aided design) generated device patterns, which is then followed by effort to replicate these device patterns in a substrate. The replication process may involve the use of various exposing techniques and a variety of subtractive (etching) and/or additive (deposition) material processing procedures. For example, in a photolithographic process, a layer of photo-resist material may first be applied on top of a substrate, and then be exposed selectively according to a pre-determined device pattern or patterns. Portions of the photo-resist that are exposed to light or other ionizing radiation (e.g., ultraviolet, electron beams, X-rays, etc.) may experience some changes in their solubility to certain solutions. The photo-resist may then be developed in a developer solution, thereby removing the non-irradiated (in a negative resist) or irradiated (in a positive resist) portions of the resist layer, to create a photo-resist pattern or photo-mask. The photo-resist pattern or photo-mask may subsequently be copied or transferred to the substrate underneath the photo-resist pattern.

There are numerous techniques used by those skilled in the art to remove material at various stages of creating a semiconductor structure. As used herein, these processes are referred to generically as "etching". For example, etching includes techniques of wet etching, dry etching, chemical oxide removal (COR) etching, and reactive ion etching (RIE), which are all known techniques to remove select material(s) when forming a semiconductor structure. The Standard Clean 1 (SC1) contains a strong base, typically ammonium hydroxide, and hydrogen peroxide. The SC2 contains a strong acid such as hydrochloric acid and hydrogen peroxide. The techniques and application of etching is well understood by those skilled in the art and, as such, a more detailed description of such processes is not presented herein.

Although the overall fabrication method and the structures formed thereby are novel, certain individual processing steps required to implement the method may utilize conventional semiconductor fabrication techniques and conventional semiconductor fabrication tooling. These techniques and tooling will already be familiar to one having ordinary skill in the relevant arts given the teachings herein. Moreover, one or more of the processing steps and tooling used to fabricate semiconductor devices are also described in a number of readily available publications, including, for example: James D. Plummer et al., *Silicon VLSI Technology: Fundamentals, Practice, and Modeling* $1^{st}$ *Edition*, Prentice Hall, 2001 and P. H. Holloway et al., *Handbook of Compound Semiconductors: Growth, Processing, Characterization, and Devices*, Cambridge University Press, 2008, which are both hereby incorporated by reference herein. It is emphasized that while some individual processing steps are set forth herein, those steps are merely illustrative, and one skilled in the art may be familiar with several equally suitable alternatives that would be applicable.

It is to be appreciated that the various layers and/or regions shown in the accompanying figures may not be drawn to scale. Furthermore, one or more semiconductor layers of a type commonly used in such integrated circuit devices may not be explicitly shown in a given figure for ease of explanation. This does not imply that the semiconductor layer(s) not explicitly shown are omitted in the actual integrated circuit device.

Given the discussion thus far, it will be appreciated that, in general terms, an exemplary method of forming a semiconductor structure includes forming, on a first wafer 101, a power distribution network including a first buried power rail 109, a power wire 105, and a first buried via 107 electrically interconnecting (i.e., creating an electrically conductive path between) the first buried power rail and the power wire. Further steps include forming a lower oxide layer 111 outward of the buried power rail; bonding a second wafer oxide layer 115 of a second wafer 113 to the lower oxide layer 111; and forming a first field effect transistor in the second wafer. The at least one field effect transistor has a source/drain region 123 and a gate 132. Still further steps include forming a first via trench contact 139 electrically interconnecting the source/drain region to the first buried power rail; forming an electrical path (discussed below) outward from the power wire; and forming a first outer wire 167 during back-end-of-line processing, the first outer wire being in electrical contact with the electrical path.

Note that this description of the exemplary method is helpfully read in conjunction with the description of exemplary semiconductor structures.

Referring to FIGS. 4 and 5, one or more embodiments further include thinning the second wafer to form a thinned remaining portion 113A adjacent the second wafer oxide layer of the second wafer. Forming the at least one field effect transistor in the second wafer includes forming the at least one field effect transistor in the thinned remaining portion 113A (SmartCut is a non-limiting example).

Referring to FIG. 16, in one or more embodiments, forming the electrical path includes forming a second buried via 107 outward of the power wire; forming a second buried power rail 109 outward of the second buried via; forming a second via trench contact 139 outward of the second buried power rail; forming an electrical path contact 146 outward of the second via trench contact; and forming a sequential connection 169 outward of the electrical path contact. In forming the first outer wire 167 during back-end-of-line processing, the first outer wire is formed in electrical contact with the electrical path contact 169.

Referring to FIG. 17, in one or more other embodiments, forming the electrical path includes forming a super via 171 outward of the power wire 105; and, in forming the first outer wire during back-end-of-line processing, the first outer wire is formed in electrical contact with the super via 171.

One or more embodiments further include forming a recessed contact 143 outward of, and electrically interconnecting, the first via trench contact 139 and the source/drain region 123. At least some such embodiments further include forming a second field effect transistor in the second wafer (the second field effect transistor has a source/drain region and a gate); forming a tall contact 145 outward of the source/drain region of the second field effect transistor and in electrical contact with the source/drain region of the second field effect transistor; and forming a second outer wire 155, during the back-end-of-line processing, outward of the second field effect transistor and in electrical contact with the tall contact.

Note that reference is made, for simplicity, to first, second, third, and fourth FETS, but certain individual FETs could exhibit more than one claimed feature.

In one or more embodiments, forming the first outer wire during the back-end-of-line processing includes forming the first outer wire outward of the second outer wire. In some cases, the second outer wire 155 is formed before the first outer wire 167. In this regard "first" and "second" are used for convenience in reference and do not necessarily refer to fabrication order.

Referring to FIG. 18, in one or more embodiments, forming the power distribution network further includes forming a local interconnect 1801, and further steps include forming a third field effect transistor in the second wafer, the third field effect transistor having a source/drain region 123 and a gate 132; forming a fourth field effect transistor in the second wafer, the fourth field effect transistor having a source/drain region 123 and a gate 132; forming a second via trench contact 139 electrically interconnecting the source/drain region of the third field effect transistor to the local interconnect; and forming a third via trench contact 139 electrically interconnecting the source/drain region of the fourth field effect transistor to the local interconnect.

Referring to FIGS. 6B and 7, forming the first field effect transistor in the second wafer includes forming fins 119, and the first field effect transistor includes a fin-type field effect transistor.

In one or more embodiments, all the features are formed from the top (outer) side/direction. For example, forming the power distribution network is carried out, from an outer direction, prior to forming the lower oxide layer 111 outward of the buried power rail 109; forming the first field effect transistor in the second wafer 113A is carried out, from the outer direction, after bonding the second wafer oxide layer 115 of the second wafer 113 to the lower oxide layer 111; forming the first via trench contact 139 is carried out, from the outer direction, after forming the first field effect transistor; forming the electrical path is carried out from the outer direction; and forming the first outer wire 167 during the back-end-of-line processing is carried out from the outer direction.

In accordance with further aspects of the invention, an exemplary semiconductor structure includes a power distribution network including a first buried power rail 109, a power wire 105, and a first buried via 107 electrically interconnecting the first buried power rail and the power wire. The skilled artisan will appreciate that there can, if desired, be multiple BPRs 109, multiple vias 107, and multiple power wires 105. Also included is a dielectric layer (e.g., oxide 111, oxide 115, and any pertinent adjacent portions of the ILD) outward of the power distribution network. A first field effect transistor is outward of the dielectric layer. The first field effect transistor has a source/drain region 123 and a gate 132. Typically, there are multiple FETs each having two source-drain regions. In a non-limiting example, the FETs are fin-type FETs (FinFETs). As will be appreciated by the skilled artisan, in operation, one source/drain region will function as the source and the other source/drain region will function as the drain. The FETs can be NFETs and/or PFETs as shown in FIG. 6A. A first via trench contact (e.g. VBPR 139) electrically interconnects the source/drain region to the first buried power rail. A first outer wire 167 (typically formed in the BEOL) is outward of the first field effect transistor. An electrical path (discussed further below) electrically interconnects the first outer wire with the power wire.

Each of the first buried power rail, the power wire, and the first buried via has a liner on a corresponding bottom surface thereof and sidewalls thereof, as discussed below with respect to FIG. 20.

Figure 19:
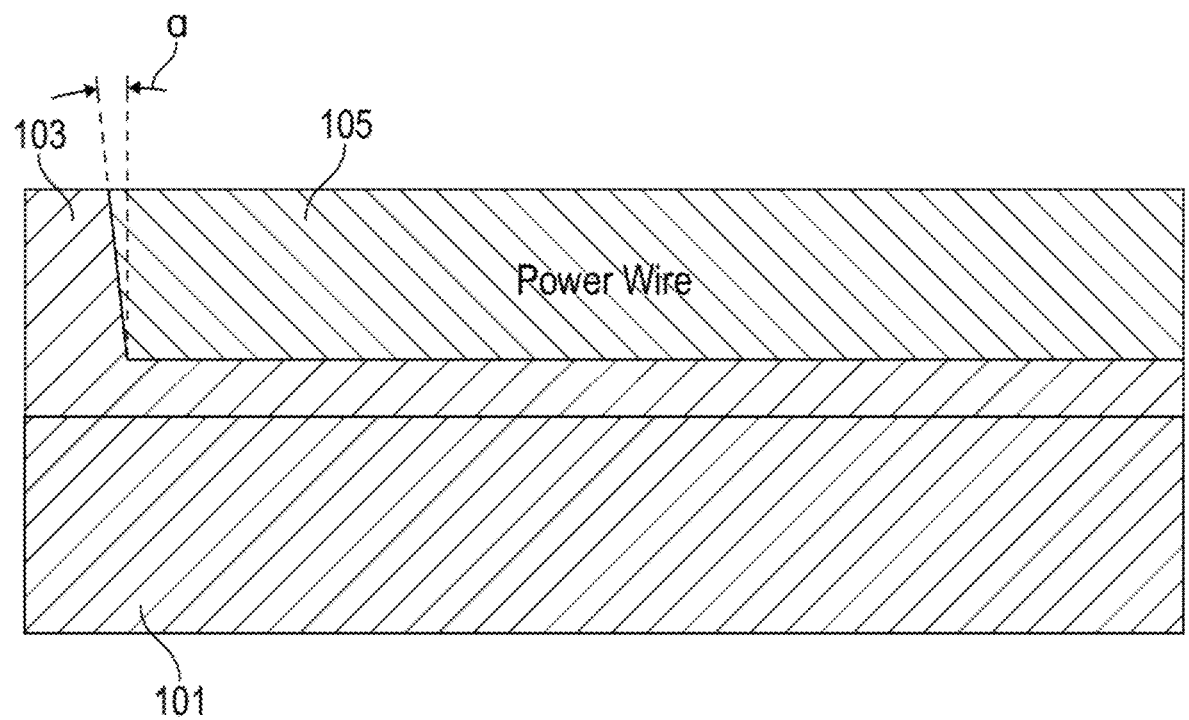
FIG. 19 shows an exemplary sidewall angle of a metallic feature, according to an aspect of the invention.

In one or more embodiments, the first buried power rail, the power wire, and the first buried via have tapered sidewalls such that a critical dimension (CD) of an outward portion of the first buried power rail is greater than that of an inward portion of the first buried power rail, a critical dimension of an outward portion of the power wire is greater than that of an inward portion of the power wire, and a critical dimension of an outward portion of the first buried via is greater than that of an inward portion of the first buried via. That is to say, the buried power rails, power wires, vias between the buried power rail and power wires, and the vias between different levels of power wires (where present, not shown) are tapered/angled, such that a CD towards the front side device (i.e., "up" in the figures) is larger than the CD towards to the substrate 101 (i.e., "down" in the figures). Referring to FIG. 19, in one or more embodiments, the sidewall taper angle α, measured from the vertical, is greater than 1 degree and less than 89 degrees. While the sidewall taper angle is shown in FIG. 19 for power wire 105, other metallic features such as the buried power rails, vias between the buried power rail and power wires, and the vias between different levels of power wires can have a similar angle. Referring to FIG. 20, in one or more embodiments, as noted, exemplary metallization materials for the power wire 105, vias 107, and BPR 109 include a thin (in a non-limiting example, from about 1 to about 5 nm) metal adhesion layer, such as a TiN liner, followed by bulk metal fill, such as W, Ruthenium, or the like, which have good thermal stability at temperatures greater than 900° C. Note the liner 2001 for the power wire 105, the liner 2003 for the vias 107, and the liner 2005 for the BPRs 109. In one or more embodiments, as depicted, because the features 105, 107, 109 are formed from the top/outer side, the metal adhesion liners 2001, 2003, 2005 are located on the bottoms and sidewalls of the features and not the tops of the features. If the features 105, 107, 109 were formed from the bottom/inner side, the metal adhesion liners would instead be located on the tops and sidewalls of the features and not the bottoms of the features. Note that portions of the top of the power wire 105 under the vias 107 abut the liner for the vias 107 but this is not a liner associated with the power wire 105; similarly, portions of the top of the vias 107 under the BPRs 109 abut the liner for the BPRs 109 but this is not a liner associated with the vias 107. Similar comments apply to the liner for the local interconnect 1801 (not shown). An enlarged view of BPR 109, via 107, liner 2005, and liner 2003 is provided for convenience.

Referring to FIG. 16, in some instances, the electrical path includes a sequential connection 169 running inward from the first outer wire, an electrical path contact 146 inward of the sequential connection, a second via trench contact 139 inward of the electrical path contact, a second buried power rail 109 inward of the second via trench contact, and a second buried via 107 inward of the second buried power rail and outward of the power wire.

Referring to FIG. 17, in some instances, the electrical path includes a super via 171.

One or more embodiments further include a recessed contact 143 outward of, and electrically interconnecting, the first via trench contact 139 and the source/drain region 123.

One or more embodiments still further include a second field effect transistor outward of the dielectric layer. The second field effect transistor has a source/drain region 123 and a gate 132. Also included are a second outer wire 155 outward of the second field effect transistor, and a tall contact 145 outward of the source/drain region 123 of the second field effect transistor and electrically interconnecting the second outer wire 155 and the source/drain region 123 of the second field effect transistor. In one or more such embodiments, the second outer wire is located in an inner metal layer (e.g., M1) as compared to the first outer wire (e.g., M4).

Referring to FIG. 18, in one or more embodiments, the power distribution network further includes a local interconnect 1801, and the structure further includes: a third field effect transistor outward of the dielectric layer, the third field effect transistor having a source/drain region 123 and a gate 132; and a fourth field effect transistor outward of the dielectric layer, the fourth field effect transistor having a source/drain region 123 and a gate 132. A second via trench contact 139 electrically interconnects the source/drain region of the third field effect transistor to the local interconnect, and a third via trench contact 139 electrically interconnects the source/drain region of the fourth field effect transistor to the local interconnect.

As discussed above, note that reference is made, for simplicity, to first, second, third, and fourth FETS, but certain individual FETs could exhibit more than one claimed feature.

In one or more embodiments, all the metal features can have tapered sidewalls tapered in the same direction/orientation, indicating that all are formed from the front side.

Thus, for example, in one or more embodiments, the first via trench contact and the first outer wire also have tapered sidewalls such that a critical dimension of an outward portion of the first via trench contact is greater than that of an inward portion of the first via trench contact, and a critical dimension of an outward portion of the first outer wire is greater than that of an inward portion of the first outer wire.

In one or more embodiments, the critical dimension of the first buried power rail, the critical dimension of the power wire, and the critical dimension of the first buried via each include a corresponding width when viewed in a cross-fin cross section and/or an along-fin cross section. In one or more embodiments, this is generally true for all metal features having tapered sidewalls tapered in the same direction/orientation.

The epitaxial deposition process (e.g., for the S/D regions 123) may employ the deposition chamber of a chemical vapor deposition type apparatus, such as a low pressure chemical vapor deposition (LPCVD) apparatus. A number of different precursors may be used for the epitaxial deposition of an undoped, intrinsic Si layer and in situ doped silicon material forming a heavily doped layer. In some embodiments, the gas source for the deposition of an epitaxially formed semiconductor layers may include silicon (Si) deposited from silane, disilane, trisilane, tetrasilane, hexachlorodisilane, tetrachlorosilane, dichlorosilane, trichlorosilane, disilane and combinations thereof. Examples of other epitaxial growth processes that can be employed in growing semiconductor layers described herein include rapid thermal chemical vapor deposition (RTCVD), low-energy plasma deposition (LEPD), ultra-high vacuum chemical vapor deposition (UHVCVD), atmospheric pressure chemical vapor deposition (APCVD) and molecular beam epitaxy (MBE).

By "in-situ" it is meant that the dopant that dictates the conductivity type of doped layer is introduced during the process step, for example epitaxial deposition, that forms the doped layer. The terms "epitaxial growth and/or deposition" and "epitaxially formed and/or grown," mean the growth of a semiconductor material (crystalline material) on a deposition surface of another semiconductor material (crystalline material), in which the semiconductor material being grown (crystalline overlayer) has substantially the same crystalline characteristics as the semiconductor material of the deposition surface (seed material). In an epitaxial deposition process, the chemical reactants provided by the source gases are controlled, and the system parameters are set so that the depositing atoms arrive at the deposition surface of the semiconductor substrate with sufficient energy to move about on the surface such that the depositing atoms orient themselves to the crystal arrangement of the atoms of the deposition surface. Therefore, an epitaxially grown semiconductor material has substantially the same crystalline characteristics as the deposition surface on which the epitaxially grown material is formed. In-situ doping of a heavily doped layer can be conducted using conventional precursor materials and techniques, for example silane with diborane or phosphane depending on the conductivity type required.

Those skilled in the art will appreciate that the exemplary structures discussed above can be distributed in raw form (i.e., a single wafer having multiple unpackaged chips), as bare dies, in packaged form, or incorporated as parts of intermediate products or end products that benefit from use of one or more aspects of the disclosed early buried power rail (BPR) and backside power distribution network (BSPDN) scheme.

An integrated circuit in accordance with aspects of the present inventions can be employed in essentially any application and/or electronic system where one or more aspects of the disclosed early buried power rail (BPR) and backside power distribution network (BSPDN) scheme would be beneficial. Given the teachings of the present disclosure provided herein, one of ordinary skill in the art will be able to contemplate other implementations and applications of embodiments disclosed herein.

The illustrations of embodiments described herein are intended to provide a general understanding of the various embodiments, and they are not intended to serve as a complete description of all the elements and features of apparatus and systems that might make use of the circuits and techniques described herein. Many other embodiments will become apparent to those skilled in the art given the teachings herein; other embodiments are utilized and derived therefrom, such that structural and logical substitutions and changes can be made without departing from the scope of this disclosure. It should also be noted that, in some alternative implementations, some of the steps of the exemplary methods may occur out of the order noted in the figures. For example, two steps shown in succession may, in fact, be executed substantially concurrently, or certain steps may sometimes be executed in the reverse order, depending upon the functionality involved. The drawings are also merely representational and are not drawn to scale. Accordingly, the specification and drawings are to be regarded in an illustrative rather than a restrictive sense.

Embodiments are referred to herein, individually and/or collectively, by the term "embodiment" merely for convenience and without intending to limit the scope of this application to any single embodiment or inventive concept if more than one is, in fact, shown. Thus, although specific embodiments have been illustrated and described herein, it should be understood that an arrangement achieving the same purpose can be substituted for the specific embodiment(s) shown; that is, this disclosure is intended to cover any and all adaptations or variations of various embodiments. Combinations of the above embodiments, and other embodiments not specifically described herein, will become apparent to those of skill in the art given the teachings herein.

The terminology used herein is for the purpose of describing particular embodiments only and is not intended to be limiting. As used herein, the singular forms "a," "an" and "the" are intended to include the plural forms as well, unless the context clearly indicates otherwise. It will be further understood that the terms "comprises" and/or "comprising," when used in this specification, specify the presence of stated features, steps, operations, elements, and/or components, but do not preclude the presence or addition of one or more other features, steps, operations, elements, components, and/or groups thereof. Terms such as "bottom", "top", "above", "over", "under" and "below" are used to indicate relative positioning of elements or structures to each other as opposed to relative elevation. If a layer of a structure is described herein as "over" another layer, it will be understood that there may or may not be intermediate elements or layers between the two specified layers. If a layer is described as "directly on" another layer, direct contact of the two layers is indicated. As the term is used herein and in the appended claims, "about" means within plus or minus ten percent.

The corresponding structures, materials, acts, and equivalents of any means or step-plus-function elements in the claims below are intended to include any structure, material, or act for performing the function in combination with other claimed elements as specifically claimed. The description of the various embodiments has been presented for purposes of illustration and description, but is not intended to be exhaustive or limited to the forms disclosed. Many modifications and variations will be apparent to those of ordinary skill in the art without departing from the scope and spirit thereof. The embodiments were chosen and described in order to best explain principles and practical applications, and to enable others of ordinary skill in the art to understand the various embodiments with various modifications as are suited to the particular use contemplated.

The abstract is provided to comply with 37 C.F.R. § 1.76(b), which requires an abstract that will allow the reader to quickly ascertain the nature of the technical disclosure. It is submitted with the understanding that it will not be used to interpret or limit the scope or meaning of the claims. In addition, in the foregoing Detailed Description, it can be seen that various features are grouped together in a single embodiment for the purpose of streamlining the disclosure. This method of disclosure is not to be interpreted as reflecting an intention that the claimed embodiments require more features than are expressly recited in each claim. Rather, as the appended claims reflect, the claimed subject matter may lie in less than all features of a single embodiment. Thus, the following claims are hereby incorporated into the Detailed Description, with each claim standing on its own as separately claimed subject matter.

Given the teachings provided herein, one of ordinary skill in the art will be able to contemplate other implementations and applications of the techniques and disclosed embodiments. Although illustrative embodiments have been described herein with reference to the accompanying drawings, it is to be understood that illustrative embodiments are not limited to those precise embodiments, and that various other changes and modifications are made therein by one skilled in the art without departing from the scope of the appended claims.

What is claimed is:

1. A semiconductor structure comprising:
    a power distribution network comprising a first buried power rail, a power wire, and a first buried via electrically interconnecting the first buried power rail and the power wire, each of the first buried power rail, the power wire, and the first buried via having a liner on a corresponding bottom surface thereof and sidewalls thereof;
    a dielectric layer outward of the power distribution network;
    a first field effect transistor outward of the dielectric layer, the first field effect transistor having a source/drain region and a gate;
    a first via trench contact electrically interconnecting the source/drain region to the first buried power rail;
    a first outer wire outward of the first field effect transistor; and
    an electrical path electrically interconnecting the first outer wire with the power wire.

2. The semiconductor structure of claim 1, wherein the electrical path comprises a sequential connection running inward from the first outer wire, an electrical path contact inward of the sequential connection, a second via trench contact inward of the electrical path contact, a second buried power rail inward of the second via trench contact, and a second buried via inward of the second buried power rail and outward of the power wire.

3. The semiconductor structure of claim 1, wherein the electrical path comprises a super via.

4. The semiconductor structure of claim 1, further comprising a recessed contact outward of, and electrically interconnecting, the first via trench contact and the source/drain region.

5. The semiconductor structure of claim 4, further comprising:
    a second field effect transistor outward of the dielectric layer, the second field effect transistor having a source/drain region and a gate;
    a second outer wire outward of the second field effect transistor; and
    a tall contact outward of the source/drain region of the second field effect transistor and electrically interconnecting the second outer wire and the source/drain region of the second field effect transistor.

6. The semiconductor structure of claim 5, wherein the second outer wire is located in an inner metal layer as compared to the first outer wire.

7. The semiconductor structure of claim 1, wherein the power distribution network further comprises a local interconnect, further comprising:
    a third field effect transistor outward of the dielectric layer, the third field effect transistor having a source/drain region and a gate;
    a fourth field effect transistor outward of the dielectric layer, the fourth field effect transistor having a source/drain region and a gate;
    a second via trench contact electrically interconnecting the source/drain region of the third field effect transistor to the local interconnect; and
    a third via trench contact electrically interconnecting the source/drain region of the fourth field effect transistor to the local interconnect.

8. The semiconductor structure of claim 1, wherein the first field effect transistor comprises a fin-type field effect transistor.

9. The semiconductor structure of claim 1, wherein the sidewalls of the first buried power rail, the power wire, and the first buried via are tapered such that a critical dimension of an outward portion of the first buried power rail is greater than that of an inward portion of the first buried power rail, a critical dimension of an outward portion of the power wire is greater than that of an inward portion of the power wire, and a critical dimension of an outward portion of the first buried via is greater than that of an inward portion of the first buried via.

10. The semiconductor structure of claim 9, wherein the critical dimension of the first buried power rail, the critical dimension of the power wire, and the critical dimension of the first buried via each comprise a corresponding width when viewed in a cross-fin cross section and/or an along-fin cross section.

11. The semiconductor structure of claim 1, wherein the liner is present on, and continuous along, the corresponding bottom surface and the sidewalls of each of the first buried power rail, the power wire, and the first buried via.

12. The semiconductor structure of claim 1, wherein the sidewalls of the first buried via are tapered such that a critical dimension of an outward portion of the first buried via is greater than that of an inward portion of the first buried via.

* * * * *